(12) United States Patent
Freebern

(10) Patent No.: US 7,245,552 B2
(45) Date of Patent: Jul. 17, 2007

(54) PARALLEL DATA PATH ARCHITECTURE

(75) Inventor: Margaret Freebern, Richmond, VA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/157,868

(22) Filed: Jun. 22, 2005

(65) Prior Publication Data

US 2006/0291323 A1    Dec. 28, 2006

(51) Int. Cl.
  *G11C 8/00*    (2006.01)
(52) U.S. Cl. .................................... 365/233; 365/221
(58) Field of Classification Search ............... 365/233, 365/194, 193, 189.05, 220, 221
  See application file for complete search history.

(56) References Cited

U.S. PATENT DOCUMENTS

| | | | | |
|---|---|---|---|---|
| 5,867,446 A | * | 2/1999 | Konishi et al. ............. | 365/233 |
| 6,754,132 B2 | * | 6/2004 | Kyung ....................... | 365/233 |
| 6,901,026 B2 | * | 5/2005 | Takeuchi et al. ......... | 365/233.5 |
| 2005/0169091 A1 | * | 8/2005 | Miki et al. ............. | 365/230.03 |
| 2006/0179260 A1 | * | 8/2006 | Yoon .......................... | 711/154 |

* cited by examiner

*Primary Examiner*—Gene N. Auduong
(74) *Attorney, Agent, or Firm*—Edell, Shapiro & Finnan, LLC

(57) ABSTRACT

A memory device includes: a memory array for storing data; data pads for supplying as an output of the memory device data retrieved from the memory array in a read operation; parallel read data paths each coupled between the memory array and the data pads, where the parallel read data paths include synchronous data paths operable in different modes of operation and an asynchronous data path; and a mode selector for selecting one of the parallel read data paths to supply data retrieved from the memory array to the data pads.

28 Claims, 5 Drawing Sheets

PARALLEL DATA PATH ARCHITECTURE

BACKGROUND OF THE INVENTION

1. Field of the Invention

The present invention relates to a parallel data path architecture suitable for a pseudo-SRAM and, more particularly, to an architecture that permits reading data from a memory array in a number of different operating modes and clock frequencies.

2. Description of the Related Art

Static random access memory (SRAM) chips have commonly been employed in mobile and wireless devices such as wireless telephones. Unlike dynamic random access memory (DRAM) devices, SRAMs retain information in a memory array while power remains applied without need of periodic refresh operations. While having advantages such as speed, cost, and ease of operation, SRAMs are considerably bulkier than DRAMs of a comparable memory capacity, since each storage element (memory cell) of an SRAM memory array requires more transistors than a DRAM storage element. Read and write operations in SRAMs in mobile applications have typically been performed asynchronously (i.e., without use of a clock signal) using a signal data rate (SDR) mode (i.e., one bit is accessed with each column access pulse. By contrast, DRAMs are generally operated synchronously, using an externally supplied clock to carry out read and write operations with an SDR interface or a double date rate (DDR) interface, wherein two bits are accessed with each clock pulse, one on the rising edge and one on the falling edge.

As more features and functions have been incorporated into wireless telephones, such as digital cameras, speech processing, games, ring tones, etc., increased memory requirements have made conventional SRAMs less desirable due to size considerations. Consequently, pseudo-SRAMs are now being used in mobile applications such as wireless telephones. As is known in the art, pseudo-SRAMs are actually DRAM devices that essentially mimic the operation of SRAM devices. Like other DRAM devices, pseudo-SRAMs require a periodic refresh operation to maintain data in the memory cell array, although the refresh operation is hidden from the controller. On a DRAM, the data path is the portion of the chip that controls data flow and timing during read and write operations. During the write operation, the data path transfers data from the chip pads to the memory array where the data is stored. During a read operation, the data path brings the data out of the memory array and onto the pads so that the data can be driven off the chip to another device via a bus or the like.

The architecture and design of the data path is affected by the DRAM interface, its operating mode, and the clock frequency at which the chip is operating. Since pseudo-SRAM chips are being more widely used, for compatibility with a variety of systems and devices, it would be desirable for pseudo-SRAM chips to include an asynchronous interface of earlier SRAM chips and the synchronous interface of current commodity DRAMs. In the case of synchronous operation, such pseudo-SRAMs should be capable of operating over a wide range of clock frequencies and data latencies.

SUMMARY OF THE INVENTION

In accordance with an exemplary embodiment of the present invention, a memory device, such as a pseudo-SRAM, includes a parallel data path architecture in which plural read data paths couple the memory array to the output data pads of the memory device. The read data paths correspond to different modes of operation, and a mode selector selects which of the read data paths is used to convey data retrieved from the memory array to the output data pads based on the manner in which the memory device is being operated.

For example, the read data paths can include an asynchronous data path, which is selected for conveying retrieved data to the pads in the absence of an external clock signal being supplied to the memory device. The read data paths can also include a plurality of synchronous data paths that operation in different modes. For example, one of the synchronous data paths can operate in a latched mode suitable for lower clock frequencies, while another synchronous data path can operate in a FIFO (first-in-first-out) mode suitable for higher clock frequencies. The mode selector can select which of these synchronous data paths to employ using a clock frequency indicator. For example, in certain memory devices, the value of an externally supplied CAS (column access strobe) latency signal reflects the clock frequency and can serve as the clock frequency indicator.

In accordance with another aspect of the invention, a method of performing a read operation in a memory device includes: retrieving data from a memory array in response to receipt of a read command; selecting an asynchronous data path to supply the retrieved data to pads of the memory device in response to the absence of an external clock signal; and selecting one of a plurality of synchronous data paths to supply the retrieved data to the pads of the memory device in response to detection of an external clock signal, wherein the synchronous data path is selected as a function of an external signal received by the memory device.

Further, a method of manufacturing a memory device according to another aspect of the present invention includes: providing a plurality of parallel read data paths each coupled between a memory array and data pads of the memory device, the parallel read data paths including a plurality of synchronous data path operable in different modes of operation and an asynchronous data path; and providing a mode selector for selecting one of the parallel read data paths to supply data retrieved from the memory array to the data pads.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
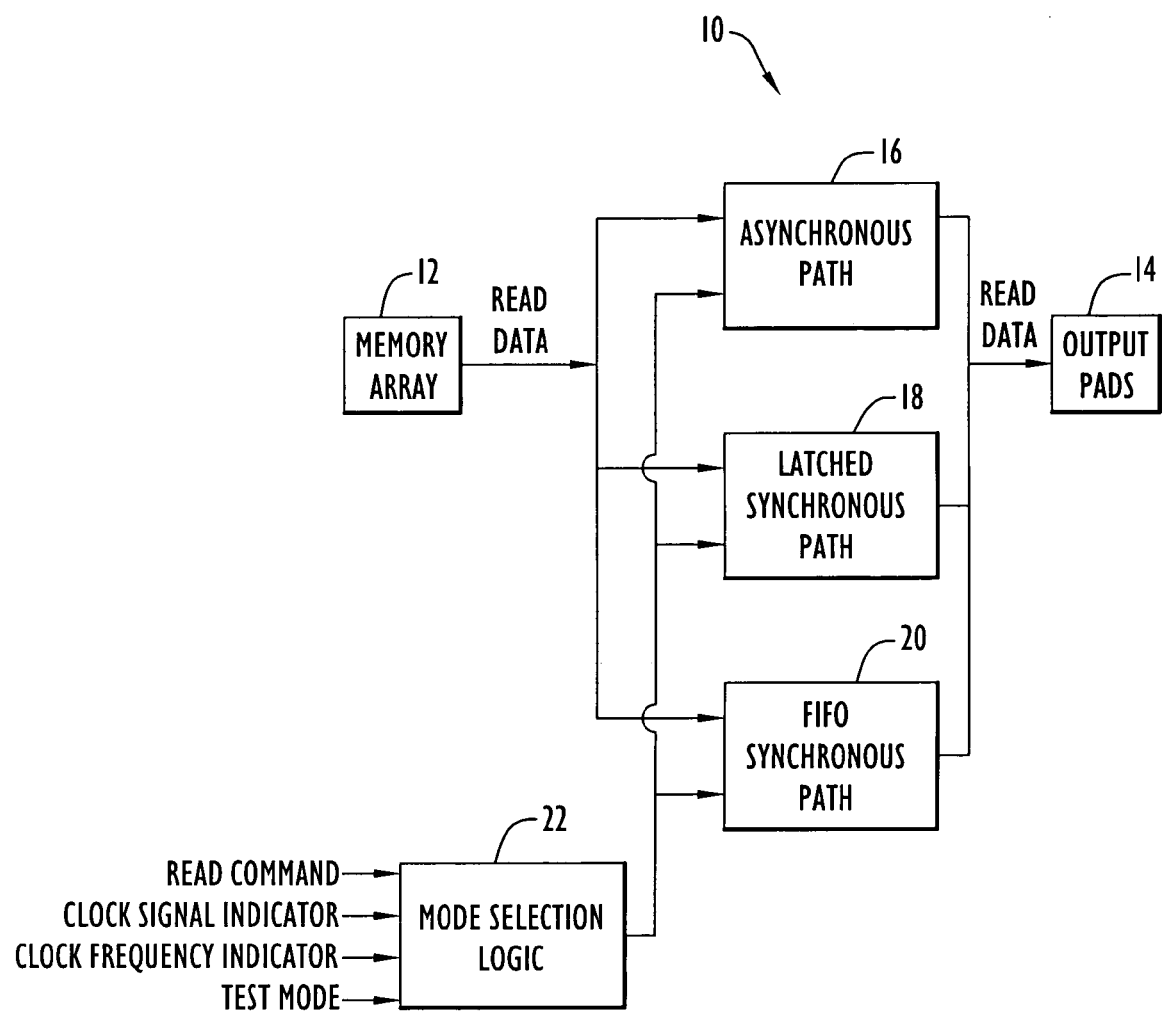
FIG. 1 is a block diagram conceptually illustrating a read data path parallel architecture in accordance with an exemplary embodiment of the present invention.

FIG. 1 conceptually depicts a read data path parallel architecture for a memory device 10 in accordance with an exemplary embodiment of the present invention. The architecture depicted in FIG. 1 is a conceptual diagram illustrating major functional units, and does not necessarily illustrate physical relationships. Memory device 10 includes a memory array 12 coupled to output pads 14 of the chip via three, independent parallel read data paths: an asynchronous data path 16, a latched synchronous data path 18, and a FIFO synchronous data path 20. The term "parallel" is used here in the electrical circuit sense (two or more paths, each of which is connected between the same two points in a circuit) and does not require the paths to be geometrically parallel. By way of a non-limiting example, memory device 10 can be a pseudo-SRAM, such as a pseudo-SRAM designed for use in mobile, wireless, or battery-powered devices. However, the invention is not limited to pseudo-SRAM devices and encompasses any memory devices in which plural, selectable data path modes may be desired for reading data.

In certain applications, it may be desirable to have a number of different modes of carrying out read operations in a memory device. For example, SRAM chips often operate as single data rate (SDR), asynchronous devices (read and write operations are performed without an external clock signal), whereas DRAM chips are typically synchronous devices operated with an SDR interface or a double data rate (DDR) interface. Many wireless telephones have conventionally used SRAM chips. As pseudo-SRAM chips (which are DRAM devices) replace SRAM chips in such applications due to size and memory requirements, it may be desirable to keep the same asynchronous customer interface so that the newer pseudo-SRAM chips are interchangeable with the older SRAM chips. A synchronous interface, in which read and write operations are performed in accordance with a clock signal, additionally permits the pseudo-SRAM chips to be used like DRAM devices.

It is common for DRAMs to be able to function at a range of clock frequencies. Since the clock signal is an externally supplied signal to the memory device, the clock speed is dictated by the requirements and design of the system in which the memory device is used. With synchronous operation, different read modes may be better suited for use at different clock frequencies. For example, a "latched" mode may be suitable for SDR read operations or operation with lower-frequency clock signals. On the other hand, a "FIFO" mode may be better for DDR read operations or operation with higher-frequency clock signals. As is known in the art, a latched mode of reading data basically involves shifting data into and out of a flip-flop. Data on the read data path is latched in the flip-flop and becomes available to the output circuitry of the chip on the same rising edge of the clock (i.e., there is a single latch in the data path to the output pads). In contrast, a FIFO mode employs a first-in-first-out (FIFO) shift register or buffering scheme involving the buffering of at least two bits (e.g., a two-bit FIFO).

In the exemplary architecture shown in FIG. 1, by having an asynchronous data path, a synchronous latched data path, and a synchronous FIFO data path, the memory device can be operated in a variety of read modes, thereby improving the interchangeability of the memory device for use in a number of different system configurations, interfaces, and applications. While the exemplary embodiment includes these three parallel read data paths and corresponding read operation modes, it will be appreciated that the invention is not limited to these three particular read paths/modes, and other combinations of read paths/modes could be implemented (i.e., additional or different modes or paths could be used).

Referring again to FIG. 1, upon receipt of an external read command, data is retrieved from memory array 12 and enters each of the three parallel data paths 16, 18, and 20. A mode selection logic module 22 (or simply "mode selector") selects one of the parallel data paths to pass the data onto the output pads 14 based on the memory device's mode of operation. The mode selector enables only one of the three data paths at a time via an enable signal, and the enabled data path drives data to the off-chip drivers to placed on the output data pads. This approach results in three independent read path modes, each with its own timing and control. As described in greater detail herein, the mode selector determines the mode of operation based on a number of signals indicative of the mode of operation of the memory device (e.g., detection of a read command, a signal indicating the presence or absence of an external clock signal, a clock frequency indicator, and test mode signals).

Figure 2:
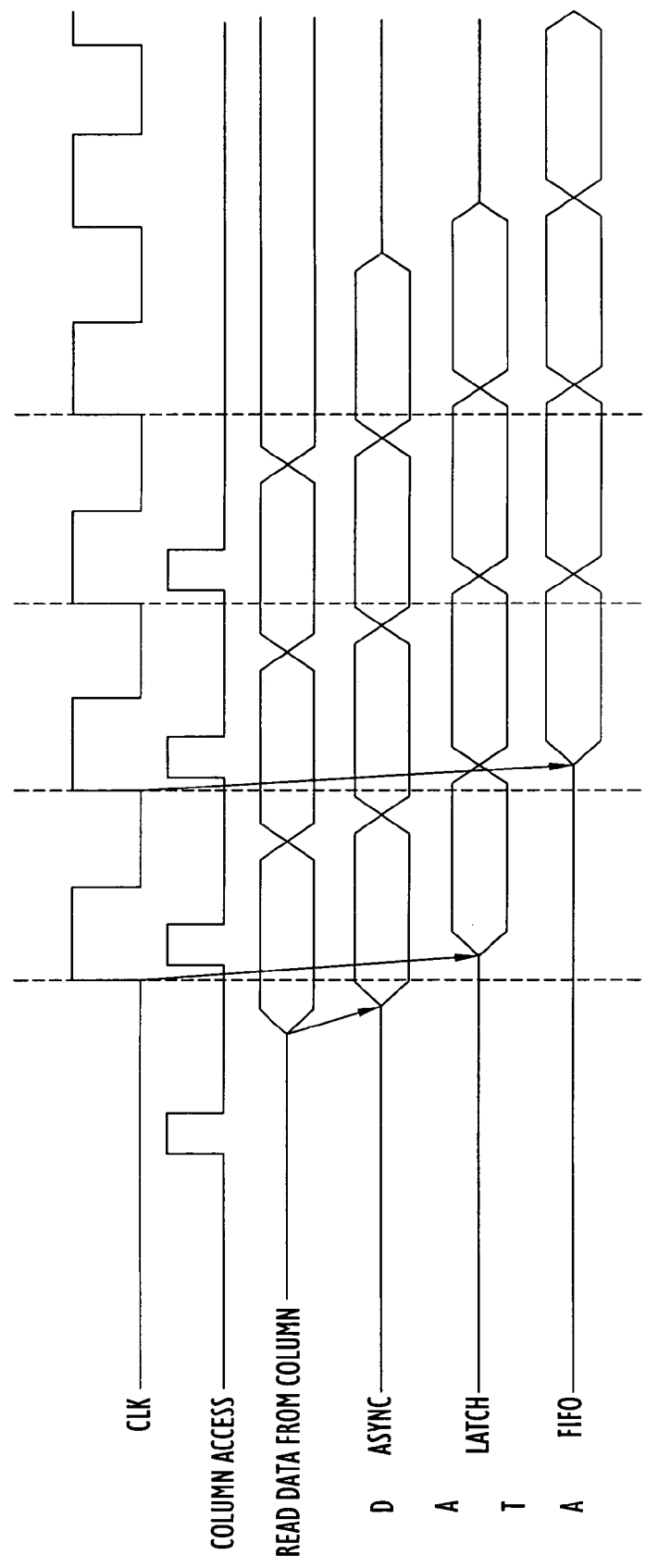
FIG. 2 is a timing diagram showing waveforms for a read access operation in the asynchronous, latched synchronous, and FIFO synchronous modes.

A more detailed explanation of operation of each data path mode is described in connection with the timing diagram of FIG. 2, which further illustrates the advantages of having three different, independent modes. The clock signal (CLK) shown in the first line of FIG. 2 is applicable only to the synchronous modes, since there is no external clock signal present in the asynchronous mode. In the asynchronous mode, upon receipt of a read signal, a series of column access signals is generated to sequentially retrieve data from columns of memory cells in the memory array in accordance with a read address (not shown). As shown in the next line of FIG. 2, there is a delay from the time of the column access pulse to when the read data from the column becomes valid on the read data path. This delay, which remains substantially constant for all read operations, is a function of the design of the memory device (e.g., hardware response times, propagation delays, etc.) and is independent of which mode is selected for reading data. In the asynchronous mode, the data becomes available at the output pads a short time after the read data from the column becomes valid, as suggested by the arrow from the data bit shown on the "read data from column" line to the "async" data line shown in FIG. 2.

In the case of the synchronous read data path modes, a clock signal is present during read operations, and the column access strobe signal is synchronized with the clock signal. Referring to the first column access pulse shown in FIG. 2, note that the corresponding "read data from column" is valid prior to the rising edge of the first clock signal occurring after the column access. Consequently, a latched mode can be employed in this case. Specifically, the rising edge of the first clock pulse after the column access pulse can be used to latch the read data from the column into a flip-flop, thereby immediately shifting the data to the output, such that the data becomes available at the output shortly after the rising edge of the clock pulse, as indicated in FIG. 2 by the arrow from the rising edge of the first clock pulse to the "latch" data line.

The clock frequency and signal timing shown in FIG. 2 is suitable for implementing the latched mode, since the data retrieved from the memory array is valid on the data path prior to the next rising edge of the clock signal. This configuration is generally possible with relatively low clock frequencies in an SDR read operation. However, as previously explained, the period of time required for the read data to become valid after the column access pulse remains substantially constant in the memory device; consequently, as the clock frequency increases, the rising edge of the next clock pulse may occur prior to the read data being valid on the data path, such that the next clock pulse cannot be used to latch the read data. In other words, as the clock frequency increases, the next rising edge of the clock signal occurs more quickly, so there is less and less margin between when the data is valid and the next rising edge of the clock (which is used to latch the data) as the clock frequency increases. Eventually, at a high enough clock frequency, the next rising edge of the clock pulse will arrive before the data is valid, such that the data cannot be latched with the next rising edge of the clock signal. Although not explicitly shown in FIG. 2, one can visualize this effect at higher clock frequencies by imagining the spacing between the column access pulses and the corresponding valid data on the "read data from column" line remaining fixed, while the spacing between successive column access pulses (and also between successive clock pulses) is reduced.

At higher clock frequencies, where the latched mode cannot be employed, the FIFO mode becomes useful. By way of a non-limiting example, a clock frequency of approximately 133 MHz could be the demarcation between lower clock frequencies for which the latched mode is used, and higher clock frequencies for which the FIFO mode is used. In general, the maximum clock frequency at which the latched mode can be used in function of particular design and operation of the memory device, and the invention is not limited to any particular maximum clock frequency for the latched synchronous mode.

In accordance with the exemplary embodiment shown in FIG. 2, in the FIFO mode, the clock signal can be latched into a FIFO register or buffer at a predetermined time after the column access signal using a timer to determine when the necessary period of time has elapsed (rather than using the clock signal directly to latch the data). The timer essentially replicates or mimics the delay caused by the circuitry of the column path plus some small additional delay to provide a buffer or margin to ensure that the data is valid. The timer is started at the timing of the column access pulse, and when the timer finishes, a pulse is issued indicating that the read data from the column is valid. Thus, in the synchronous FIFO mode, a predetermined delay is essentially built in to ensure that the read data from the column is valid on the data path prior to latching the data into the FIFO.

The pulse issued when the timer expires can be used to latch the data into the FIFO. Once latched in the FIFO, the data is shifted out on the next rising edge of the clock and becomes available at the output pads. In FIG. 2, it is assumed that the data is latched into the FIFO some time before the rising edge of the second clock pulse occurs, such that data is shifted to the output by the rising edge of the second clock pulse, as suggested by the arrow extending from the second clock pulse to the FIFO data line. In the case of a two-bit FIFO involving two sets of registers or flip-flops, two successive column accesses can arrive and be stored in the FIFO prior to the first column access being shifted to the output.

Figure 3:
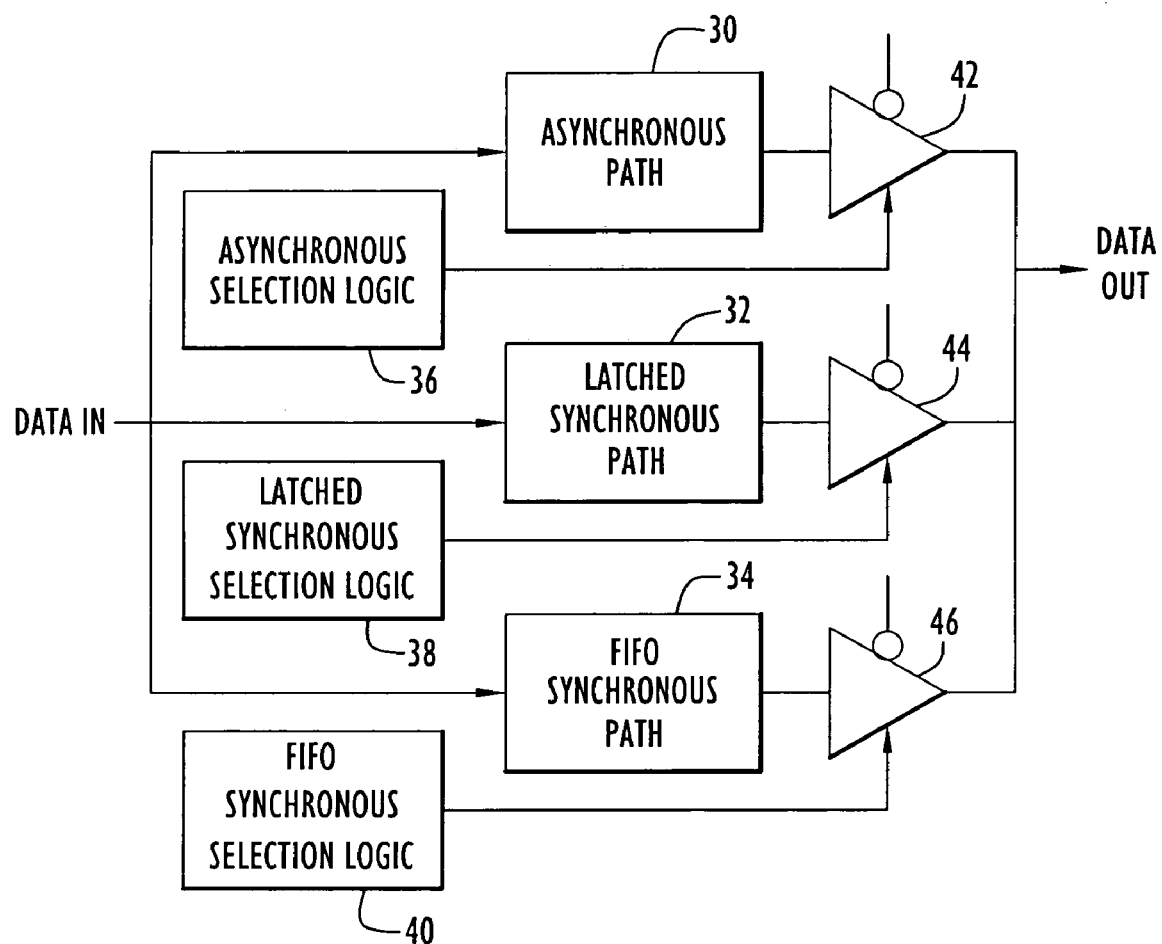
FIG. 3 is a block diagram illustrating an implementation of a parallel read path architecture in accordance with an exemplary embodiment of the present invention.

FIG. 3 illustrates a particular implementation of a parallel data path architecture in accordance with one embodiment of the present invention. For simplicity, the memory array and output pads are not shown. The data retrieved from the memory array is indicated as "data in" as it arrives at the parallel read data paths and as "data out" as it is supplied from one of the read data paths to the output pads. The data in is supplied to the three read data paths: an asynchronous path 30, a latched synchronous path 32, and a FIFO synchronous path 34. In this embodiment, the mode selector comprises three mode selection logic units: asynchronous selection logic unit 36, latched synchronous selection logic unit 38, and FIFO synchronous selection logic 40. These three mode selection logic units respectively supply enable signals to three output drivers 42, 44, and 46 respectively coupled to the outputs of asynchronous path 30, latched synchronous path 32, and FIFO synchronous path 34. Only one path is enabled at a time by supplying an enable signal to one of the output drivers 42, 44, and 46. The two output drivers associated with the two non-selected paths remain in a high-impedance state while the selected output driver supplies the data to the output. In the embodiment shown in FIG. 3, separate selection logic is employed for each of the three modes. Another option is to have mode selection logic that is common to all modes and that selectively sends an enable signal to only one of the output drivers.

Figure 4:
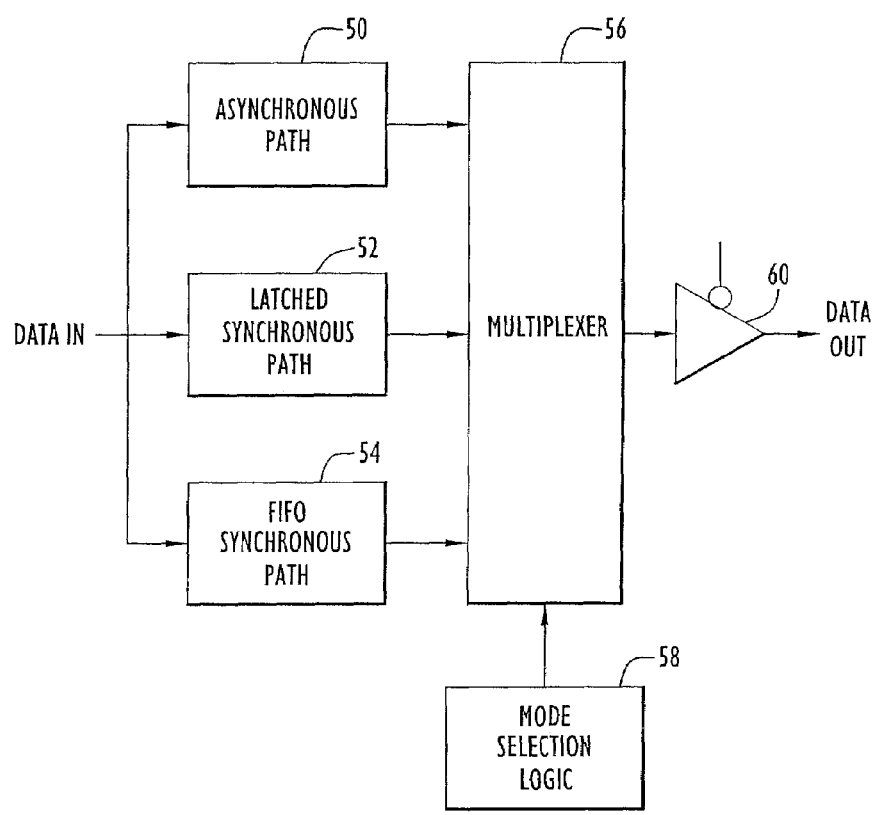
FIG. 4 is a block diagram illustrating an implementation of a parallel read path architecture in accordance with another exemplary embodiment of the present invention.

FIG. 4 illustrates another embodiment of the present invention in which the parallel data path architecture is implemented in a different manner. In this configuration, the data retrieved from the memory array is supplied to three parallel read data paths (asynchronous path 50, latched synchronous path 52, FIFO synchronous path 54), and a multiplexer 56 is used to selectively pass the data on one of the three paths to a common output driver 60. Multiplexer 56 is controlled by mode selection logic unit 58, which selects the appropriate read data path based on signals indicating the operating mode of the memory device. While shown as a multiplexer in FIG. 4, any sort of selection device or circuitry could be used. This implementation avoids the need to have a separate output driver for each read data path.

Another option is to have a multiplexer or other selection device located upstream of the parallel read data paths. In this case, the multiplexer supplies the retrieved data to only one of the three read data paths, which then supplies the data to an output driver.

As previously explained, the mode selector selects one of the parallel read data paths in accordance with the current operating mode of the memory device. An exemplary embodiment of mode selection logic used to select the read data path is illustrated in the functional flow diagram of FIG. 5. In the scheme depicted in FIG. 5, essentially three pieces of information are used to select an output read data path: the presence of a read command; the presence or absence of an external clock signal; and a clock frequency indicator. It will be appreciated that the invention is not limited to the particular logic shown in FIG. 5 or the use of these particular signals to select a read data path, and other or additional signals or logic can be used. For example, test modes signals can be used to cause a certain read data path to be selected.

A prerequisite for selecting one of the parallel read data paths is that a read command has been received by the memory device. Accordingly, in FIG. 5, the mode selection logic begins in operation 100 with the detection of a read command, an indication of which must be supplied to the mode selector. The memory device detects whether or not an external clock signal is present, and provides a signal to the mode selector indicating the presence or absence of an external clock signal. In operation 110, the mode selection logic evaluates whether the clock signal is present based on the clock signal indicator. If no clock signal is present, the mode selection logic selects the asynchronous read data path (operation 120). On the other hand, if the clock signal is present, the mode selection logic proceeds to decision block 150 to determine which of the two synchronous modes to select.

The clock frequency indicator essentially permits the mode selector to select between the latched synchronous mode, which is suitable for lower clock frequencies, and the FIFO synchronous mode, which is suitable for higher clock frequencies. Depending on the design of a particular memory device, a number of possible options may be available for supply a clock frequency indicator to select between the latched synchronous data path and the FIFO synchronous data path. One option that may be available with certain memory devices is to employ the CAS latency signal as the clock frequency indicator Due to internal delay and processing times of the output circuit, which are mainly affected by a data path delay time and an off-chip driver delay time of the output circuit, an output data item DQ does not appear simultaneously with the instant the external read command RD is applied to the chip. In order to avoid data items being generated at the output data terminal at arbitrary points in time after the external read command RD has been applied to the control terminal, the latency between applying the external read command RD and the instant when the appropriate data item appears at the output data terminal is set to a predetermined value depending on a configuration signal supplied to the chip. This latency is usually specified by the CAS latency. The CAS latency is a value which indicates the number of clock cycles between the point in time when the external read command signal RD is applied to control terminal to start a read access to a memory cell and the point in time when the data item DQ of this memory cell appears at the output data terminal.

The memory device must be supplied with a particular CAS latency value (e.g., 2, 3, 4, etc.). This value is stored in the mode register of the memory device and instructs the device to operate with a particular number of clock cycles between receipt of the read command and availability of corresponding data at the output. The CAS latency is useful in the context of the present invention, because the CAS latency often corresponds to the clock frequency. For example, a CAS latency of 2 or 3 generally corresponds to lower clock frequencies, whereas a CAS latency of 4 or more would correspond to a higher clock frequency. This is because propagation delays in the memory device are largely fixed; thus, at higher clock frequencies, a greater number of clock cycles will occur between receipt of the read command and the data arriving at the output.

Typically, a synchronous memory device will include specifications that require the user to select certain CAS latency values when supplying a clock signal in a certain frequency range. For example, in accordance with operating requirements, a CAS latency of 4 may indicate that the clock frequency being supplied is greater than 133 MHz, whereas a CAS latency of 2 or 3 may indicate that a clock frequency less than 133 MHz is being supplied. Since the CAS latency corresponds to the clock frequency, the CAS latency can be used to select between the latched synchronous mode and the FIFO synchronous mode. Continuing with the example, if the latched mode is suitable for clock frequencies below 133 MHz, a CAS latency of 2 or 3 would cause the mode selection logic to select the latched synchronous mode, whereas a CAS latency of 4 or more would cause the mode selection logic to select the FIFO synchronous mode.

Returning to FIG. 5, stated more generally, in operation 150, if the CAS latency has a high value corresponding to a clock frequency suitable for the FIFO mode, the FIFO synchronous path is selected (operation 170). If, on the other hand, the CAS latency does not have a high value (indicating a clock frequency suitable for the latched mode), in operation 160, the latched synchronous path is selected.

In the foregoing example, the CAS latency is used to select between the latched synchronous mode and the FIFO synchronous mode, since the CAS latency is indicative of the clock frequency in this example. This approach avoids the need to have circuitry on the memory device that is capable of detecting how fast the external clock is running. Another option is to include such circuitry on the memory device to detect the clock frequency and then select between the latched and FIFO modes based on the detected clock frequency. This approach, however, would require additional circuitry if the memory device does not already include the capability to determine the frequency of the external clock signal. In any event, the invention is not limited to any particular implementation for providing a clock frequency indicator, and any signal or combination of signals indicative of the clock frequency can be employed as the clock frequency indicator.

Figure 5:
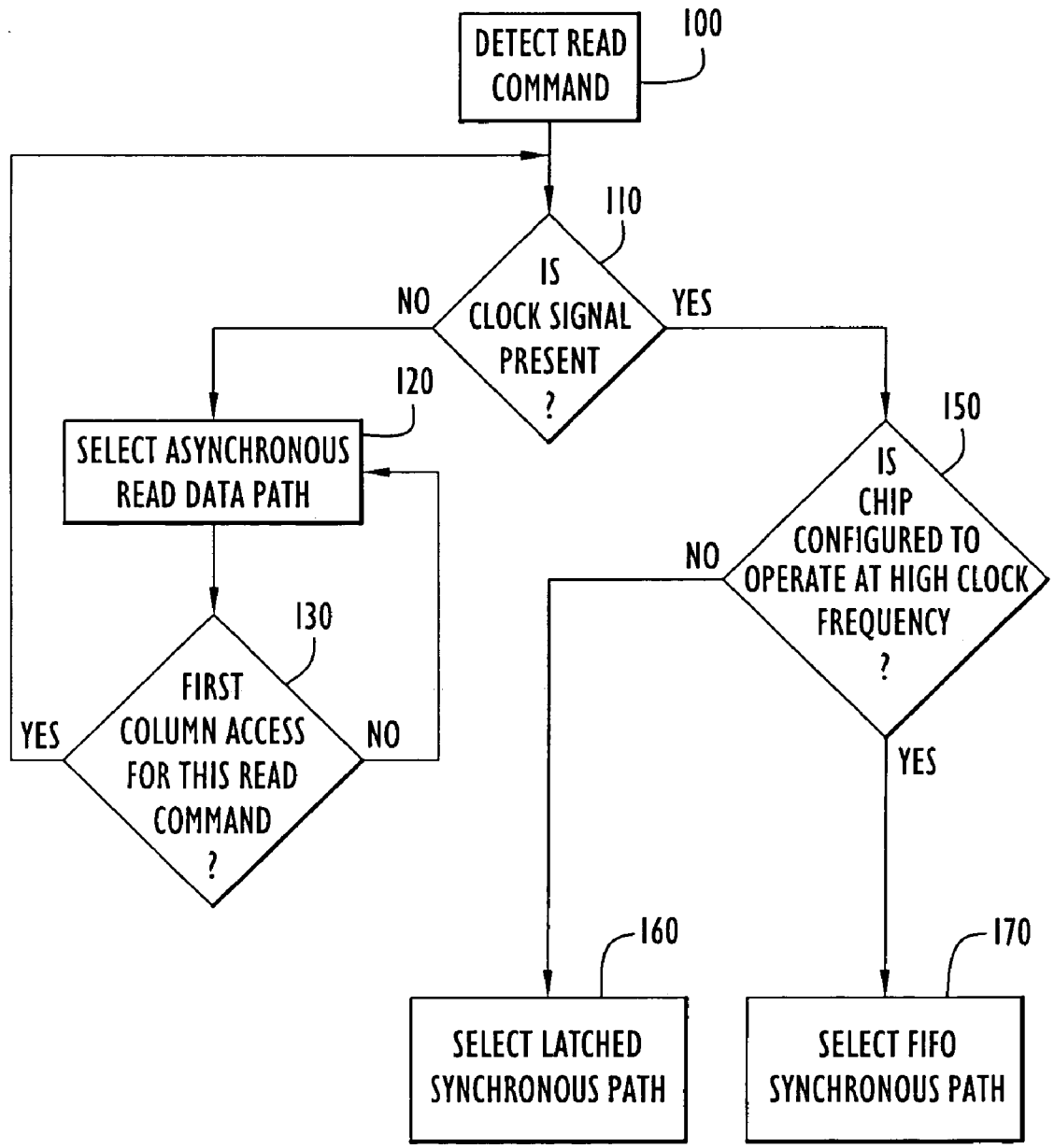
FIG. 5 is a functional flow diagram of the mode selection logic for selecting one of the parallel read data paths during a read access operation according to an exemplary embodiment of the present invention.

Depending on the design of the memory device, a potential complicating factor in the mode selection logic is that fact that it may not be possible to detect the presence of an external clock signal in time to select one of the synchronous read data paths for the first column access in a read operation. In this case, regardless of the operating mode, the first column access will be routed through the asynchronous data path. If the memory device is operating synchronously, the external clock will have been detected by the second column access, and the second and subsequent column accesses are routed over one of the synchronous data paths. This contingency is illustrated in FIG. 5. Specifically, where the asynchronous read data path has been selected (operation 120), the read operation continues with the asynchronous path if no clock signal is detected after the first column access. On the other hand, if a clock signal is detected after the first column access has been routed over the asynchronous data path, the subsequent column accesses are routed over one of the synchronous data paths. In FIG. 5, this decision logic is represented by operation 130. Specifically, if the asynchronous read data path has been selected for the first column access, the presence of the clock signal is checked; otherwise, the read operation continues in the asynchronous data path. It will be appreciated that, in an actual implementation, the presence of a clock signal may be continuously monitored during the initial portion of the read operation.

While the foregoing example involves a memory device operated at a single data rate (SDR), the invention is also applicable to DDR memory devices or memory devices in which both SDR and DDR read operations are permitted.

Having described preferred embodiments of new and improved parallel data path architecture, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A memory device, comprising:
   a memory array comprising a plurality of memory cells configured to store data;

a plurality of data pads configured to supply as an output of the memory device data retrieved from the memory array in a read operation;

a plurality of parallel read data paths each coupled between the memory array and the data pads, the parallel read data paths including: a plurality of synchronous data paths operable in different modes of operation and an asynchronous data path; and a mode selector configured to select one of the parallel read data paths to supply data retrieved from the memory array to the data pads.

2. The memory device of claim 1, wherein the memory device is a pseudo-SRAM.

3. The memory device of claim 1, wherein the plurality of synchronous data paths includes a first synchronous data path operable over a first range of clock frequencies and a second synchronous data path operable over a second range of clock frequencies that is higher than the first range of clock frequencies.

4. The memory device of claim 1, wherein the plurality of synchronous data paths includes a first synchronous data path operable in a latched mode, and a second synchronous data path operable in a first-in-first-out (FIFO) mode.

5. The memory device of claim 1, wherein the mode selector selects the asynchronous data path in response to the absence of an external clock signal.

6. The memory device of claim 1, wherein the plurality of synchronous data paths includes first and second synchronous data paths, and wherein, in the presence of an external clock signal, the mode selector selects the first synchronous data path in response to a column access strobe (CAS) latency command having a first value, and selects the second synchronous data path in response to the CAS latency command having a second value.

7. A memory device, comprising:

a memory array comprising a plurality of memory cells configured to store data;

a plurality of data pads configured to supply as an output of the memory device data retrieved from the memory array in a read operation;

a plurality of parallel read data paths each coupled between the memory array and the data pads, the parallel read data paths including: an asynchronous data path, a first synchronous data path operable in a latched mode over a first range of clock frequencies, and a second synchronous data path operable in a first-in-first-out (FIFO) mode over a second range of clock frequencies that is higher than the first range of clock frequencies; and a mode selector configured to select one of the parallel read data paths to supply data retrieved from the memory array to the data pads.

8. The memory device of claim 7, wherein the memory device is a pseudo-SRAM.

9. The memory device of claim 7, wherein the mode selector selects the asynchronous data path in response to the absence of an external clock signal.

10. The memory device of claim 7, wherein, in the presence of an external clock signal, the mode selector selects the first synchronous data path in response to a column access strobe (CAS) latency command having a first value and selects the second synchronous data path in response to the CAS latency command having a second value.

11. A memory device, comprising:

a memory array comprising a plurality of memory cells configured to store data;

a plurality of data pads configured to supply as an output of the memory device data retrieved from the memory array in a read operation;

a plurality of parallel read data paths each coupled between the memory array and the data pads, the parallel read data paths including an asynchronous data path and a plurality of synchronous data paths; and a mode selector configured to select one of the parallel read data paths to supply data retrieved from the memory array to the data pads, wherein the mode selector selects the asynchronous data path in response to the absence of an external clock signal, and, in the presence of an external clock signal, selects one of the synchronous data paths as a function of a value of a column access strobe (CAS) latency command.

12. The memory device of claim 11, wherein the memory device is a pseudo-SRAM.

13. The memory device of claim 11, wherein the plurality of synchronous data paths includes a first synchronous data path that operates in a latched mode and a second synchronous data path that operates in a first-in-first-out (FIFO) mode.

14. A pseudo static random access memory (pseudo-SRAM), comprising:

a memory array comprising a plurality of memory cells configured to store data;

a plurality of data pads configured to supply as an output of the memory device data retrieved from the memory array in a read operation;

a plurality of parallel read data paths each coupled between the memory array and the data pads, the parallel read data paths including: an asynchronous data path, a first synchronous data path operable in a latched mode over a first range of clock frequencies, and a second synchronous data path operable in a first-in-first-out (FIFO) mode over a second range of clock frequencies that is higher than the first range of clock frequencies; and a mode selector configured to select one of the parallel read data paths to supply data retrieved from the memory array to the data pads, wherein the mode selector selects the asynchronous data path in response to the absence of an external clock signal, and, in the presence of an external clock signal, selects one of the first and second synchronous data paths as a function of a value of a column access strobe (CAS) latency command.

15. A memory device, comprising:

means for storing data;

output means for supplying as an output of the memory device data retrieved from the means for storing data;

a plurality of parallel read data paths each coupled between the means for storing data and the output means, the parallel read data paths including: a plurality of synchronous data paths operable in different modes of operation and an asynchronous data path; and means for selecting one of the parallel read data paths to supply data retrieved from the means for storing data to the output means.

16. The memory device of claim 15, wherein the memory device is a pseudo-SRAM.

17. The memory device of claim 15, wherein the plurality of synchronous data paths includes a first synchronous data path operable over a first range of clock frequencies and a second synchronous data path operable over a second range of clock frequencies that is higher than the first range of clock frequencies.

18. The memory device of claim 15, wherein the plurality of synchronous data paths includes a first synchronous data path operable in a latched mode, and a second synchronous data path operable in a first-in-first-out (FIFO) mode.

19. The memory device of claim 15, wherein the means for selecting selects the asynchronous data path in response to the absence of an external clock signal.

20. The memory device of claim 15, wherein the plurality of synchronous data paths includes first and second synchronous data paths, and wherein, in the presence of an external clock signal, the means for selecting selects the first synchronous data path in response to a column access strobe (CAS) latency command having a first value, and selects the second synchronous data path in response to the CAS latency command having a second value.

21. A method of performing a read operation in a memory device, comprising:
 (a) retrieving data from a memory array in response to receipt of a read command;
 (b) selecting an asynchronous data path to supply the retrieved data to pads of the memory device in response to the absence of an external clock signal; and
 (c) selecting one of a plurality of synchronous data paths to supply the retrieved data to the pads of the memory device in response to detection of an external clock signal, wherein said one of the plurality of synchronous data paths is selected as a function of an external signal received by the memory device.

22. The method of claim 21, wherein the external signal is a column access strobe (CAS) latency signal.

23. The method of claim 22, wherein the plurality of synchronous data paths includes first synchronous data path operable in a latched mode and a second synchronous data path operable in a first-in-first-out (FIFO) mode, and wherein (c) includes selecting the first synchronous data path in response to the CAS latency signal having a first value, and selecting the second synchronous data path in response to the CAS latency signal having a second value.

24. The method of claim 23, wherein the first synchronous data path is operable over a first range of clock frequencies and the second synchronous data path is operable over a second range of clock frequencies that is higher than the first range of clock frequencies.

25. A method of manufacturing a memory device, comprising:
 (a) providing a plurality of parallel read data paths each coupled between a memory array and a plurality of data pads of the memory device, the parallel read data paths including a plurality of synchronous data path operable in different modes of operation and an asynchronous data path; and
 (b) providing a mode selector for selecting one of the parallel read data paths to supply data retrieved from the memory array to the data pads.

26. The method of claim 25, wherein (a) includes providing a first synchronous data path operable in a latched mode and a second synchronous data path operable in a first-in-first-out (FIFO) mode.

27. The method of claim 25, wherein the mode selector selects the asynchronous data path in response to the absence of an external clock signal.

28. The method of claim 25, wherein (a) includes providing first and second synchronous data paths, and wherein, in the presence of an external clock signal, the mode selector selects the first synchronous data path in response to a column access strobe (CAS) latency signal having a first value, and selects the second synchronous data path in response to the CAS latency signal having a second value.

* * * * *

UNITED STATES PATENT AND TRADEMARK OFFICE
CERTIFICATE OF CORRECTION

PATENT NO. : 7,245,552 B2
APPLICATION NO. : 11/157868
DATED : July 17, 2007
INVENTOR(S) : Margaret Freebern Page 1 of 1

It is certified that error appears in the above-identified patent and that said Letters Patent is hereby corrected as shown below:

On the Title Page Item (75) Inventor: "VA" should be "VT"

Signed and Sealed this

Fifteenth Day of April, 2008

JON W. DUDAS
*Director of the United States Patent and Trademark Office*